(12) United States Patent
Kim et al.

(10) Patent No.: US 11,171,019 B2
(45) Date of Patent: Nov. 9, 2021

(54) SUBSTRATE TREATING APPARATUS, METHOD FOR MEASURING DISCHARGE AMOUNT BY USING THE SAME, AND SUBSTRATE TREATING METHOD

(71) Applicant: SEMES CO., LTD., Chungcheongnam-do (KR)

(72) Inventors: Jaeyong Kim, Chungcheongnam-do (KR); Raetaek Oh, Chungcheongnam-do (KR); Taekyoub Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 168 days.

(21) Appl. No.: 15/858,120

(22) Filed: Dec. 29, 2017

(65) Prior Publication Data

US 2018/0185886 A1 Jul. 5, 2018

(30) Foreign Application Priority Data

Dec. 30, 2016 (KR) .................. 10-2016-0183817
Apr. 14, 2017 (KR) .................. 10-2017-0048255

(51) Int. Cl.
*H01L 21/02* (2006.01)
*H01L 21/67* (2006.01)
(Continued)

(52) U.S. Cl.
CPC .......... *H01L 21/67051* (2013.01); *B08B 3/04* (2013.01); *G01F 23/00* (2013.01); *H01L 21/67017* (2013.01); *H01L 21/67253* (2013.01)

(58) Field of Classification Search
None
See application file for complete search history.

(56) References Cited

U.S. PATENT DOCUMENTS

| 4,344,469 A | * | 8/1982 | Brown | ................ A01M 21/043 |
| | | | | 137/240 |
| 2010/0095981 A1 | * | 4/2010 | Kamikawa | ........ H01L 21/67028 |
| | | | | 134/3 |

(Continued)

FOREIGN PATENT DOCUMENTS

| CN | 103377870 A | 10/2013 |
| CN | 103674164 A | 3/2014 |

(Continued)

OTHER PUBLICATIONS

Translation of Abstractor JP10-216605 by Yuji Igawa, published Aug. 18, 1998.*

(Continued)

*Primary Examiner* — Mikhail Kornakov
*Assistant Examiner* — Ryan L Coleman
(74) *Attorney, Agent, or Firm* — Carter, DeLuca & Farrell LLP

(57) ABSTRACT

Disclosed are an apparatus and a method for treating a substrate. The substrate treating apparatus includes a flow rate measuring unit includes a container located outside the housing and having an accommodation space an upper side of which is opened and in which the treatment liquid discharged from the treatment liquid nozzle is accommodated, in the interior thereof, a measurement member configured to measure an amount of the treatment liquid accommodated in the accommodation space, and a drain line through which the treatment liquid in the container is discharged.

26 Claims, 10 Drawing Sheets

(51) Int. Cl.
G01F 23/00 (2006.01)
B08B 3/04 (2006.01)

(56) References Cited

U.S. PATENT DOCUMENTS

| | | | |
|---|---|---|---|
| 2013/0020284 A1* | 1/2013 | Osada | H01L 21/67028 |
| | | | 216/57 |
| 2016/0247697 A1 | 8/2016 | Sawashima et al. | |
| 2016/0271640 A1* | 9/2016 | Tomita | B05D 1/02 |

FOREIGN PATENT DOCUMENTS

| | | | |
|---|---|---|---|
| CN | 103968900 A | | 8/2014 |
| CN | 104501916 A | | 4/2015 |
| CN | 105091957 A | | 11/2015 |
| GN | 103447256 A | | 12/2013 |
| GN | 105575854 A | | 5/2016 |
| JP | 10-216605 | * | 8/1998 |
| JP | 2014067910 A | | 4/2014 |
| KR | 20060009774 A | | 2/2006 |
| KR | 1020140117202 A | | 10/2014 |
| KR | 20160054145 A | | 5/2016 |

OTHER PUBLICATIONS

Translation of JP10-216605 by Yugi Igawa, published Aug. 18, 1998.*
Translation of JP10-216605 by Igawa, published Aug. 18, 1998.*
Chinese Office Action issued in corresponding CN Patent Application No. 201711476724.3, dated May 8, 2021, pp. 1-19, with English Translation.

* cited by examiner

SUBSTRATE TREATING APPARATUS, METHOD FOR MEASURING DISCHARGE AMOUNT BY USING THE SAME, AND SUBSTRATE TREATING METHOD

CROSS-REFERENCE TO RELATED APPLICATIONS

A claim for priority under 35 U.S.C. § 119 is made to Korean Patent Application No. 10-2016-0183817 filed on Dec. 30, 2016 and Korean Patent Application No. 10-2017-0048255 filed on Apr. 14, 2017, in the Korean Intellectual Property Office, the entire contents of which are hereby incorporated by reference.

BACKGROUND

Embodiments of the inventive concept described herein relate to an apparatus and a method for treating a substrate.

Contaminants such as particles, organic contaminants, and metallic contaminants on a surface of a substrate greatly influence the characteristics and yield rate of a semiconductor device. Due to this, a cleaning process of removing various contaminants attached to a surface of a substrate is very important, and a process of cleaning a substrate is performed before and after unit processes for manufacturing a semiconductor. In general, a process of cleaning a substrate includes a chemical treating process of removing metallic substances, organic substances, and particles residing on a substrate by using a treatment liquid such as a chemical, a rinsing process of removing the chemical residing on the substrate by using pure water, and a drying process of drying the substrate by using an organic solvent, a supercritical fluid, or a nitrogen gas.

The process of supplying a chemical to a substrate to treat the substrate as in a cleaning process requires a process of accurately adjusting a discharge amount per time of a nozzle that discharges the liquid for precise treatment of the substrate. Accordingly, an apparatus for supplying a liquid to a substrate to treating the substrate periodically measures a discharge amount per time of the nozzle.

When the discharge amount per time of the nozzle is measured, the operator measures a flow rate of a liquid discharged from the nozzle by directly using a jig cover and a measuring cylinder. Further, it is not easy to drain the liquid accommodated in the measuring cylinder. Accordingly, when the used liquid is classified as a toxic material, the operation procedure is complex and the operation is exposed to danger.

SUMMARY

Embodiments of the inventive concept provide an apparatus and a method for easily measuring a discharge amount of a nozzle.

Embodiments of the inventive concept also provide an apparatus and a method for easily discharging a liquid used to measure a discharge amount of a nozzle.

Embodiments of the inventive concept also provide an apparatus and a method for preventing an operator from being exposed to danger when a discharge amount of nozzle is measured.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides a substrate treating apparatus. The substrate treating apparatus includes a housing that provides a space for performing a substrate treating process therein, a support unit that supports the substrate within the housing and rotates the substrate, a treatment liquid nozzle that supplies a treatment liquid to the substrate positioned on the support unit, and a flow amount measuring unit that measures a discharge amount of the treatment liquid discharged by the treatment liquid nozzle, and the flow rate measuring unit includes a container located outside the housing and having an accommodation space an upper side of which is opened and in which the treatment liquid discharged from the treatment liquid nozzle is accommodated, in the interior thereof, a measurement member configured to measure an amount of the treatment liquid accommodated in the accommodation space, and a drain line through which the treatment liquid in the container is discharged.

The measurement member may include a measurement window provided in an area of a side wall of the container and through which the treatment liquid accommodated in the accommodation space is observed, and a measurement gradient by which a level of the treatment liquid accommodated in the accommodation space is formed in the measurement window.

The treatment liquid nozzle may include a first nozzle and a second nozzle that are moved independently from each other, the container may include a main container having a main accommodation space to which the first nozzle discharges the treatment liquid, and a first auxiliary container having a first auxiliary accommodation space to which the second nozzle discharges the treatment liquid, and when viewed from the top, the area of the first auxiliary container may be smaller than the area of the main container.

The treatment liquid discharged to the first auxiliary container may be introduced into the main accommodation space, and the measurement window may be provided in a side wall of the main container.

The depth of the first auxiliary accommodation space may be smaller than the depth of the main accommodation space, the first auxiliary accommodation space may be communicated with the main accommodation space, and a bottom surface of the first auxiliary accommodation space may be inclined downwards along a direction that faces the main accommodation space.

The treatment liquid nozzle may further include a third nozzle that move independently, and the container may further include a second auxiliary container having a second auxiliary accommodation space to which the third nozzle discharges the treatment liquid, and when viewed from the top, the area of the second auxiliary container may be smaller than the area of the main container.

The depth of the second auxiliary accommodation space may be smaller than the depth of the main accommodation space, the second auxiliary accommodation space may be communicated with the main accommodation space, and a bottom surface of the second auxiliary accommodation space may be inclined downwards along a direction that faces the main accommodation space.

The first auxiliary container and the second auxiliary container may be provided on opposite sides with respect to the main container.

An overflow preventing line that prevents the treatment liquid from overflowing from the accommodation space may be connected to a side wall of the container.

The substrate treating apparatus may further include a plurality of standby ports located outside the housing, in which the treatment liquid nozzle stands by, and configured to discharge the treatment liquid discharged by the treatment liquid nozzle to the outside, and at least one of the standby ports is provided as the flow rate measuring unit.

The standby ports may include a first standby port that discharges the treatment liquid discharged from the first nozzle to the outside, a second standby port that discharges the treatment liquid discharged from the second nozzle to the outside, and a third standby port that discharges the treatment liquid discharged from the third nozzle to the outside, the second standby port, the first standby port, and the third standby port may be sequentially arranged in a row, the first standby port may be provided as the flow rate measuring unit, the first auxiliary container may be located between the main container and the second standby port, and the second auxiliary container may be located between the main container and the third standby port.

The inventive concept also provides a method for measuring a discharge amount of a treatment liquid of a treatment liquid nozzle by using the substrate treating apparatus. The method includes discharging the treatment liquid into the accommodation space by the treatment liquid nozzle, and measuring an amount of the treatment liquid in the accommodation space by the treatment liquid nozzle.

The discharging of the treatment liquid may include discharging the treatment liquid to a specific amount from a minimum amount to not more than a maximum value that is measured by a measurement gradation to the accommodation space by the treatment liquid nozzle.

The method may further include, before the discharging of the treatment liquid, closing the drain valve.

The method may further include, after the measuring of the treatment liquid, discharging the treatment liquid in the accommodation space to the outside by opening the drain valve.

The inventive concept also provides a method for treating a substrate by using the substrate treating apparatus. The method may include measuring a discharge amount of the treatment liquid of the treatment liquid nozzle, adjusting the discharge amount of the treatment liquid of the treatment liquid nozzle, and treating the substrate by supplying the treatment liquid to the substrate positioned on the support unit by the treatment liquid nozzle.

The measuring of the discharge amount may include discharging the treatment liquid into the accommodation space by the treatment liquid nozzle, and measuring an amount of the treatment liquid in the accommodation space.

The measuring of the discharge amount may further include before the discharging of the treatment liquid, closing the drain valve.

The measuring of the discharge amount may further include after the measuring of the treatment liquid, discharging the treatment liquid in the accommodation space to the outside by opening the drain valve.

The discharging of the treatment liquid may include discharging the treatment liquid to a specific amount from a minimum amount to not more than a maximum value that is measured by a measurement gradation to the accommodation space by the treatment liquid nozzle.

The treating of the substrate may include positioning the substrate on the support unit, and supplying the treatment liquid onto the substrate by the treatment liquid nozzle.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

In an embodiment of the inventive concept, a substrate treating apparatus for performing a process of cleaning a substrate will be described. However, the inventive concept is not limited thereto, but may be applied to various types of apparatuses that apply a liquid onto a substrate.

Hereinafter, examples of the apparatus and the method of the inventive concept will be described in detail with reference to the accompanying drawings.

Figure 1:
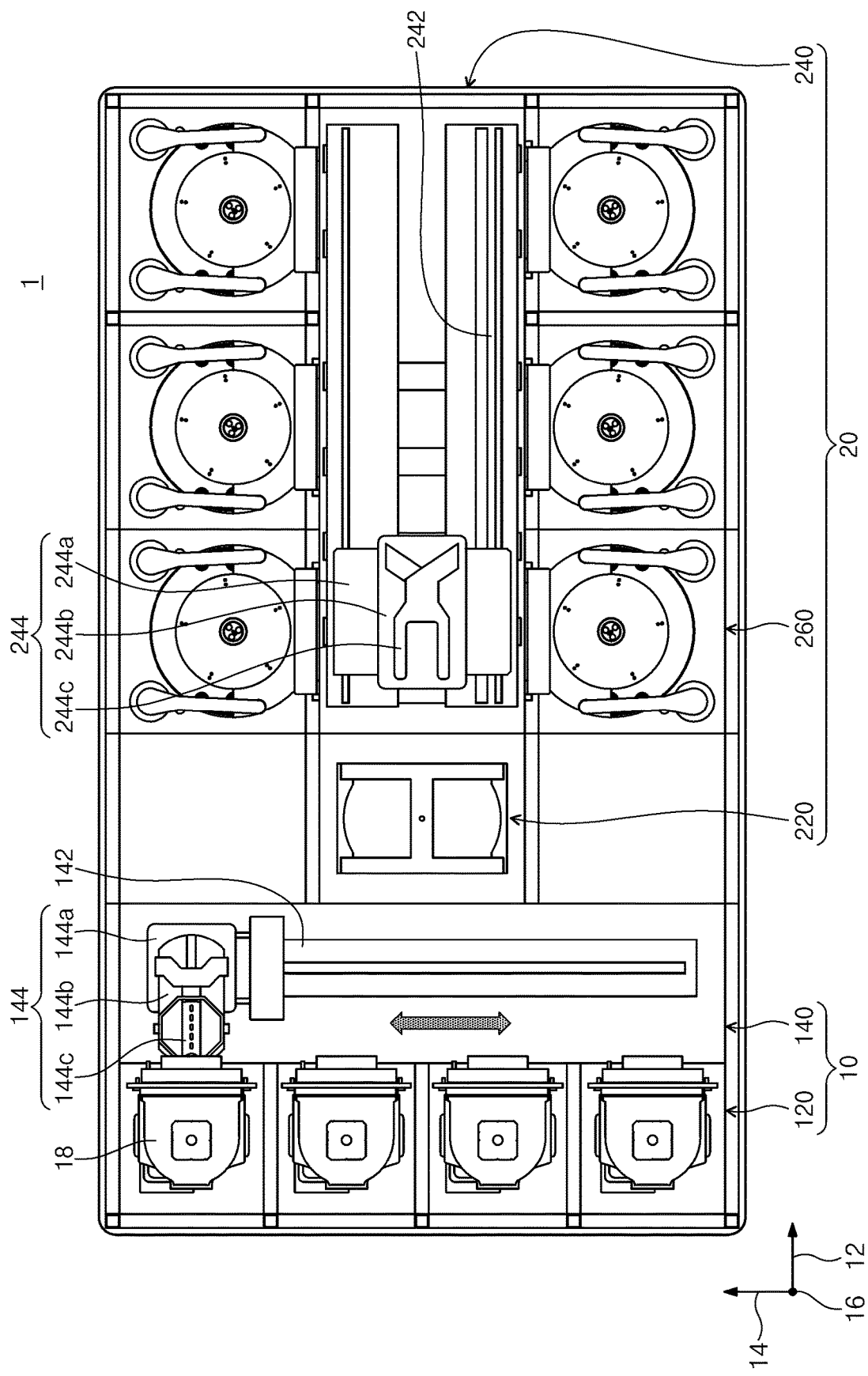
FIG. 1 is a plan view schematically illustrating a substrate treating system according to the inventive concept.

FIG. 1 is a plan view schematically illustrating a substrate treating system 1 according to the inventive concept. Referring to FIG. 1, the substrate treating system 1 has an index module 10 and a process treating module 20, and the index module 10 has a plurality of load ports 120 and a feeding frame 140. The load ports 120, the feeding frame 140, and the process executing module 20 may be sequentially arranged in a row. Hereinafter, a direction in which the load port 120, the feeding frame 140, and the process treating module 20 will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 18, in which a substrate W is received, is seated on the load port 120. A plurality of load ports 120 are provided, and are disposed along the second direction 14 in a row. FIG. 1 illustrates that four load ports 120 are provided. The number of the load ports 120 may be increased or decreased according to the process efficiency of the process executing module 20, a footprint condition, and the like. A plurality of slots (not illustrated) provided to support peripheries of substrates W are formed in the carrier 18. A plurality of slots are provided along the third direction 16, and the substrate W is situated in the carrier 130 such that the substrates W are stacked to be spaced apart from each other along the third direction 16. A front opening unified pod (FOUP) may be used as the carrier 18.

The process treating module 20 includes a buffer unit 220, a feeding chamber 240, and a plurality of process chambers 260. The feeding chamber 240 is disposed such that the lengthwise direction thereof is in parallel to the first direction 12. The process chambers 260 are disposed on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are disposed along the lengthwise direction of the feeding chamber 240. Furthermore, some of the process chambers 260 are disposed to be stacked on each other. That is, the process chambers 260 having an array of A by B (A and B are natural numbers) may be disposed on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 18 in the process treating module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are disposed to be stacked so as to be spaced apart from each other along the third direction 16. The main arms 244c used when the substrates W are transported from the buffer unit 220 to the process chambers 260 and the main arms 244c used when the substrates W are transported from the process chambers 260 to the buffer unit 220 may be different.

Substrate treating apparatuses 300 that perform cleaning processes on the substrates W are provided in the process chambers 260. The substrate treating apparatuses 300 provided in the process chambers 260 may have different structures according to the types of performed cleaning processes. Selectively, the substrate treating apparatuses 300 in the process chambers 260 may have the same structure. Selectively, the process chambers 260 may be classified into a plurality of groups such that the substrate treating apparatuses 300 provided in the process chambers 260 pertaining to the same group have the same structure and the substrate treating apparatuses 300 provided in the process chambers 260 pertaining to different groups has different structures. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
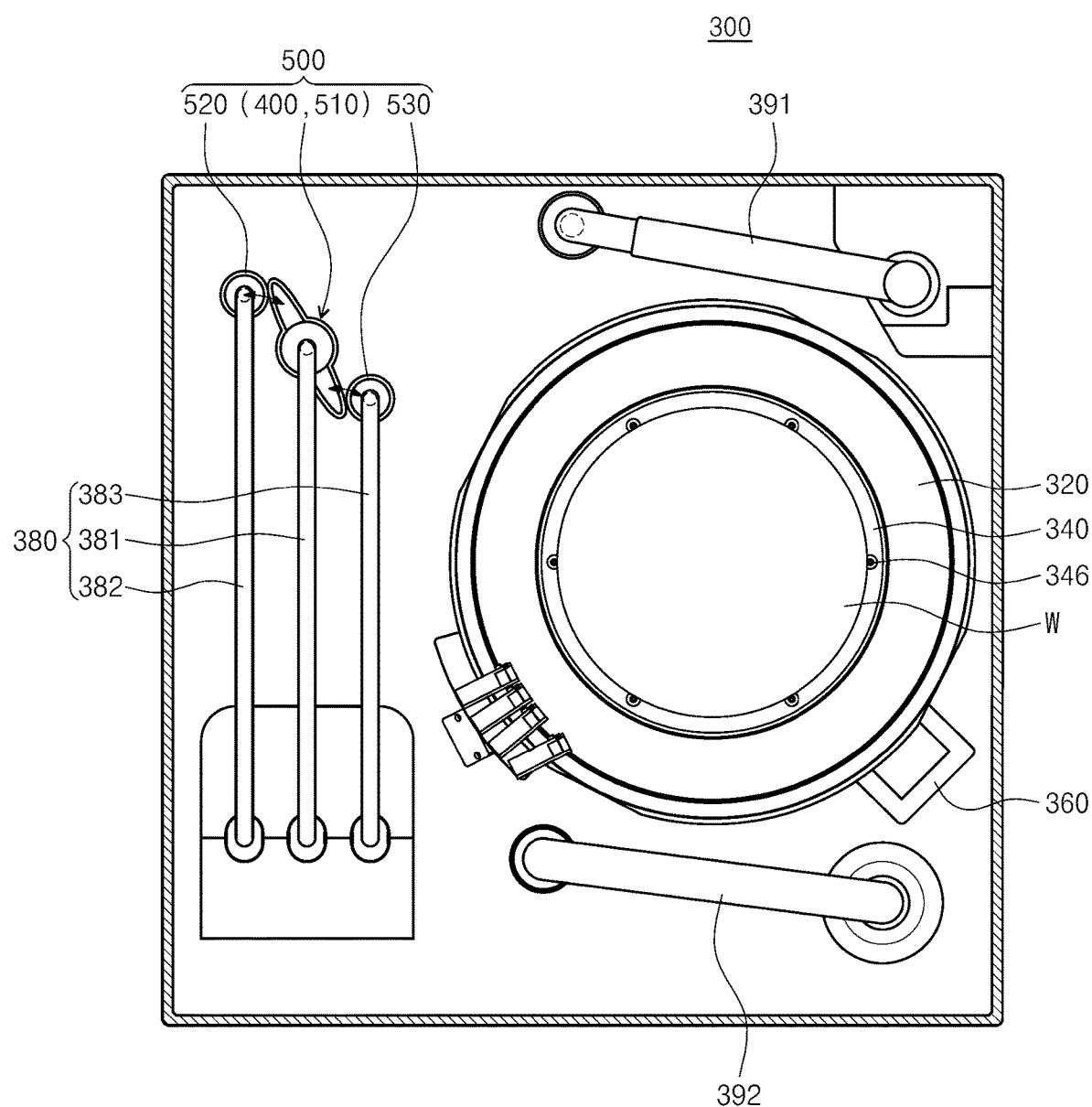
FIG. 2 is a plan view illustrating an example of a substrate treating apparatus.
Figure 3:
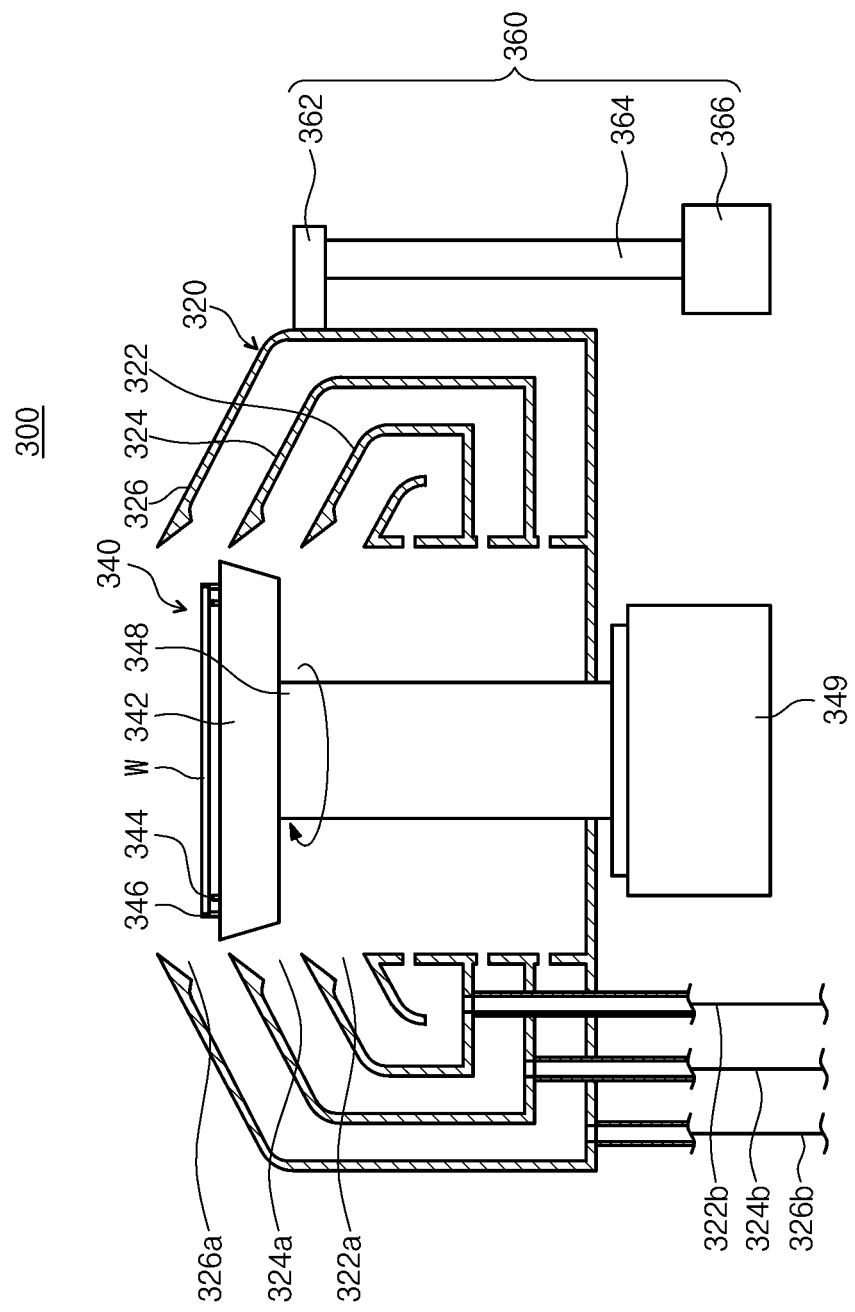
FIG. 3 is a sectional view illustrating the substrate treating apparatus of FIG. 2.

Hereinafter, an example of a substrate treating apparatus 300 that cleans a substrate W by using a treatment liquid will be described. FIG. 2 is a plan view illustrating an example of the substrate treating apparatus 300. FIG. 3 is a sectional view illustrating the substrate treating apparatus 300 of FIG. 2. Referring to FIGS. 2 and 3, the substrate treating apparatus 300 includes a housing 320, a support unit 340, an elevation unit 360, a treatment liquid nozzle 380, a flow rate measuring unit 400, and a standby port 500.

The housing 320 has a space for performing a substrate treating process in the interior thereof, and an upper side of the housing 320 is opened. The housing 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the support unit 340, the intermediate recovery vessel 324 has an annular ring shape that surrounds the inner recovery vessel 322, and the outer recovery vessel has an annular ring shape that surrounds the intermediate recovery vessel 324. An inner space 322*a* of the inner recovery vessel 322, a space 324*a* between the inner recovery vessel 322 and the intermediate recovery vessel 324, and a space 326*a* between the intermediate recovery vessel 324 and the outer recovery vessel 326 function as inlets through which the treatment liquids are introduced into the inner recovery vessel 322, the intermediate recovery vessel 324, and the outer recovery vessel 326. Recovery lines 322*b*, 324*b*, and 326*b* extending from the recovery vessels 322, 324, and 326 perpendicularly in the downward direction of the bottom surfaces thereof are connected to the recovery vessels 322, 324, and 326, respectively. The recovery lines 322*b*, 324*b*, and 326*b* discharge the treatment liquid introduced through the recovery vessels 322, 324, and 326. The discharged treatment liquids may be reused through an external treatment liquid recycling system (not illustrated).

The support unit 340 is arranged in the housing 320. The support unit 340 supports the substrate W. The support unit 340 may be provided in the spin head 340 that rotates the supported substrate W. According to an embodiment, the spin head 340 is arranged within the housing 320. The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance. A plurality of chuck pins 346 are provided. The chuck pins 346 are disposed to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the housing 320 upwards and downwards. When the housing 320 moves upwards and downwards, a relative height of the housing 320 to the spin head 340 is changed. The elevation unit 360 has a bracket 362, a movable shaft 364, and a driver 366. The bracket 362 is fixedly installed on an outer wall of the housing 320, and the movable shaft 364 that moves upwards and downwards by the driver 366 is fixedly coupled to the bracket 362. The housing 320 is lowered such that, when the substrate W is positioned on the spin head 340 or is lifted from the spin head 340, the housing 320 is lowered such that the spin head 340 protrudes to the upper side of the housing 320. When the process is performed, the height of the housing 320 is adjusted such that the treatment liquid are introduced into the preset recovery vessel 360 according to the kind of the treatment liquid supplied to the substrate W. For example, the substrate W is located at a height corresponding to an interior space 322*a* of the inner recovery vessel 322 while the substrate W is treated by a first treatment fluid. Further, the substrate W may be located at a height corresponding to a space 324*a* between the inner recovery vessel 322 and the intermediate recovery vessel 324 and a space 326*a* between the intermediate recovery vessel 324 and the outer recovery vessel 3265 while the substrate W is treated by a second treatment liquid and a third treatment liquid. Unlike those described above, the elevation unit 360 may be provided to move the spin head 340, instead of the housing 320, upwards and downwards.

The treatment liquid nozzle 380 supplies the treatment liquid onto the substrate W positioned on the spin head 340. According to an embodiment, a plurality of nozzles may be provided. The treatment liquid nozzles 380 may supply different treatment liquids onto the substrate W positioned on the spin head 340. For example, the treatment liquid nozzles 380 include a first nozzle 381, a second nozzle 382, and a third nozzle 383. The first nozzle 381 may supply a first treatment liquid, the second nozzle 382 may supply a second treatment liquid, and the third nozzle 383 may supply a third treatment liquid. The first nozzle 381, the second nozzle 382, and the third nozzle 383 may move independently. For example, the first nozzle 381, the second nozzle 382, and the third nozzle 383 may move to process locations and standby locations. The process locations are locations at which the discharge holes of the first nozzle 381, the second nozzle 382, and the third nozzle 383, through which the treatment is discharged, are located on the vertically upper side of the housing 320, and the standby locations are locations at which the discharge holes of the first nozzle 381, the second nozzle 382, and the third nozzle 383, through which the treatment is discharged, deviate from the vertical upper side of the housing 320. The first nozzle 381, the second nozzle 382, and the third nozzle 383 may be swing type nozzles. The first nozzle 381, the second nozzle 382, and the third nozzle 383 supply the treatment liquid to an area including a central area on the substrate W positioned on the spin head 340. The treatment liquid may be an organic solvent such as isopropyl alcohol (IPA).

The substrate treating apparatus 300 may further include a rinsing liquid nozzle 391 that supplies a rinsing liquid for rinsing the substrate W positioned on the spin head 340, and a dry gas supply nozzle 392 that supplies a dry gas for drying the substrate W onto the substrate W positioned on the spin head 340. The dry gas may be an inert gas that is heated. For example, the dry gas may be a nitrogen gas that is heated.

Figure 4:
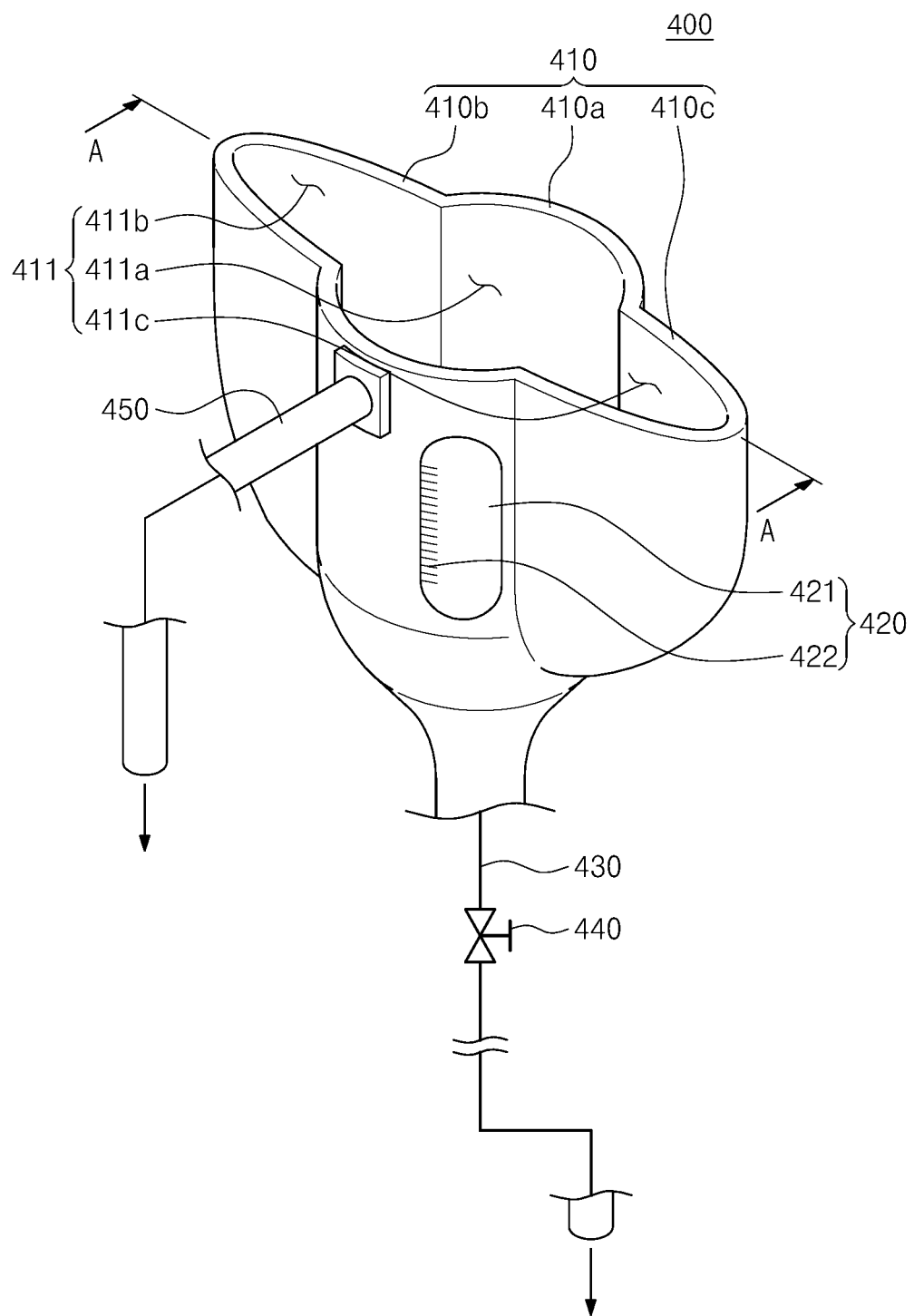
FIG. 4 is a perspective view illustrating an example of a flow rate measuring unit of FIG. 2.
Figure 5:
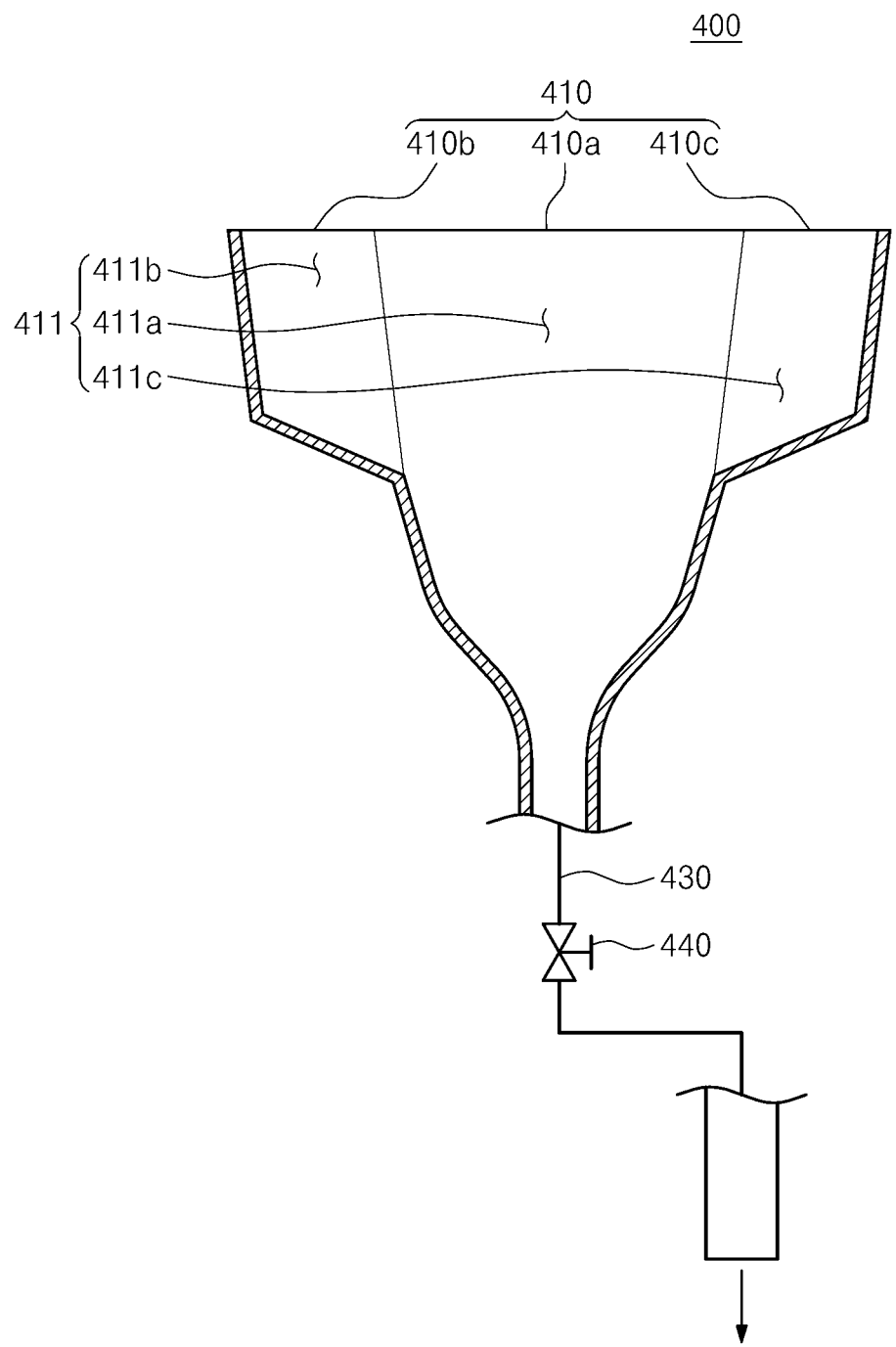
FIG. 5 is a sectional view of the flow rate measuring unit of FIG. 4, when viewed from direction AA.

FIG. 4 is a perspective view illustrating an example of a flow rate measuring unit 400 of FIG. 2. FIG. 5 is a sectional view of the flow rate measuring unit 400 of FIG. 4, when viewed from direction AA. Referring to FIGS. 2, 4, and 5, the flow rate measuring unit 400 measures a discharge amount of the treatment liquid discharged from the treatment liquid nozzle 380. For example, the flow rate measuring unit 400 measures a discharge amount per unit time of the treatment liquid discharged from the treatment liquid nozzle 380. According to an embodiment, the flow rate measuring unit 400 includes a container 410, a measuring unit 420, a drain line 430, a drain valve 440, and an overflow preventing line 450.

The container 410 is located outside the housing 320. The container 410 has an accommodation space 411 in the interior thereof. An upper side of the accommodation space is opened. The treatment liquid discharged from the treatment liquid nozzle 380 is accommodated in the accommodation space 411. According to an embodiment, the container 410 includes a main container 410a, a first auxiliary container 410b, and a second auxiliary container 410c.

The main container 410a has a main accommodation space 411a, to which the first nozzle 381 discharges the treatment liquid, in the interior thereof. The first auxiliary container 410b has a first auxiliary accommodation space 411b to which the second nozzle 382 discharges the treatment liquid, in the interior thereof. The second auxiliary container 410c has a second auxiliary accommodation space 411c to which the third nozzle 383 discharges the treatment liquid, in the interior thereof. According to an embodiment, the first auxiliary container 410b and the second auxiliary container 410c protrude from a side wall of the main container 410a to the outside. When viewed from the top, the area of the first auxiliary container 410b and the area of the second auxiliary container 410b are smaller than the area of the main container 410a. Accordingly, the spaces occupied by the first auxiliary container 410b and the second auxiliary container 410c may be reduced, and an interference with other configurations of the apparatus may be minimized. The treatment liquid discharged to the first auxiliary container 410b and the second auxiliary container 410c may be introduced into the main accommodation space 411a. For example, the depths of the first auxiliary accommodation space 411b and the second auxiliary accommodation space 411c are smaller than the depth of the main accommodation space 411a. The first auxiliary accommodation space 411b and the second auxiliary accommodation space 411c are communicated with the main accommodation space 411a. The bottom surfaces of the first auxiliary accommodation space 411b and the second auxiliary accommodation space 411c are inclined downwards along a direction that faces the main accommodation space 411a. The first auxiliary container 410b and the second auxiliary container 410c may be provided on opposite sides with respect to the main container 410a. Unlike this, the container 410 may have various shapes by which the treatment liquid nozzles 380 may easily discharge the treatment liquid into the accommodation space.

The measurement member 420 may measure the amount of the treatment liquid accommodated in the accommodation space 411. According to an embodiment, the measurement member 420 includes a measurement window 421. The measurement window 421 is provided in an area of the side wall of the container 410. The treatment liquid accommodated in the accommodation space 411 may be observed through the measurement window 421. For example, the measurement window 421 may be provided in the side wall of the main container 410a. Unlike this, according to locations at which the measurer measures the level of the treatment liquid accommodated in the accommodation space 411, the measurement window 421 may be provided in a side wall of the first auxiliary container 410b or the second auxiliary container 410c such that the measurer may easily measure the level of the treatment liquid. A measurement gradation 422 is formed in the measurement window 421. The level of the treatment liquid accommodated in the accommodation space 411 may be measured by using the measurement gradation 422.

The treatment liquid in the accommodation space 411 is discharged through the drain line 430. The drain line 430 may be connected to the bottom surface of the container 410. According to an embodiment, the drain line 430 is connected to a lower end wall of the main container 410a to be communicated with the main accommodation space 411a.

The drain valve 440 opens and closes the drain line 430. The drain valve 440 may be provided on the drain line 430. In order to measure the discharge amount of the treatment liquid nozzle 380, the drain valve 440 closes the drain line 430 while the treatment liquid nozzle 380 discharges the treatment liquid into the accommodation space, and opens the drain line 430 otherwise. Unlike this, when the flow rate of the treatment liquid that may be discharged through the drain line 430 is smaller than the discharge amount of the treatment liquid nozzle 380, the drain line 430 may be maintained in an opened state while the treatment liquid is discharged into the accommodation space and also in the other cases to measure the discharge amount of the treatment liquid nozzle 380.

The overflow preventing line 450 prevents the treatment liquid form overflowing from the accommodation space 411. The overflow preventing line 450 is connected to the side wall of the container 410 to be communicated with the accommodation space 411. For example, the overflow preventing line 450 is connected to a location that is higher than the measurement window 421 of the side wall of the main container 410a. Accordingly, the treatment liquid accommodated in the accommodation space 411, which corresponding to a level that exceeds a height that may be measured by using the measurement window 421 and the measurement gradation 422, is discharged through the overflow preventing line 450. The maximum flow rate of the treatment liquid, which the overflow preventing line 450 may accommodate, may be the same or more than the maximum flow rate of the treatment liquid that may be discharged from the treatment liquid nozzle 380.

The standby port 500 is located outside the housing 320. The treatment liquid nozzle 380 stands by in the standby port 500. That is, when the treatment liquid nozzle 380 is located at the standby location, the treatment liquid nozzle 380 is located at a location at which the treatment liquid may be discharged to the standby port 500. The standby port 500 discharges the treatment liquid discharged from the treatment liquid nozzle 380 to the outside. Because the treatment liquid of a specific amount is discharged from the standby port 500 before the treatment liquid is discharged onto the substrate W positioned on the spin head 340, the solidified treatment liquid that is adjacent to the discharge hole and the treatment liquid that may be mixed with foreign substances are removed from the treatment liquid nozzle 380. The number of the standby ports 500 may correspond to the number of the treatment liquid nozzles 380. At least one of the standby ports 500 may be provided to the flow rate measuring unit 400. According to an embodiment, the standby port 500 includes a first standby port 510, a second standby port 520, and a third standby port 530. The first nozzle 381 discharges the treatment liquid while standing by on the first standby port 510. The first standby port 510 discharges the treatment liquid discharged from the first nozzle 381 to the outside. The second nozzle 382 discharges the treatment liquid while standing by on the second standby port 520. The second standby port 520 discharges the treatment liquid discharged from the second nozzle 382 to the outside. The third nozzle 383 discharges the treatment liquid while standing by on the third standby port 530. The third standby port 530 discharges the treatment liquid discharged from the third nozzle 383 to the outside. The second standby port 520, the first standby port 510, and the third standby port 530 are sequentially arranged in a row. The first standby port 510 may be provided in the flow rate measuring unit 400. In this case, the first auxiliary container 410b is located between the main container 410a and the second standby port 520, and the second auxiliary container 410c is located between the main container 410a and the third standby port 530. Accordingly, the first auxiliary container 410b and the second auxiliary container 410c are located such that the second nozzle 382 and the third nozzle 383 may be easily moved between the standby locations and the first auxiliary container 410b and the second auxiliary container 410c. Further, because one of the standby ports 500 is provided in the flow rate measuring unit 400, a separate space for installing the flow rate measuring unit 400 in the apparatus is not required.

Figure 6:
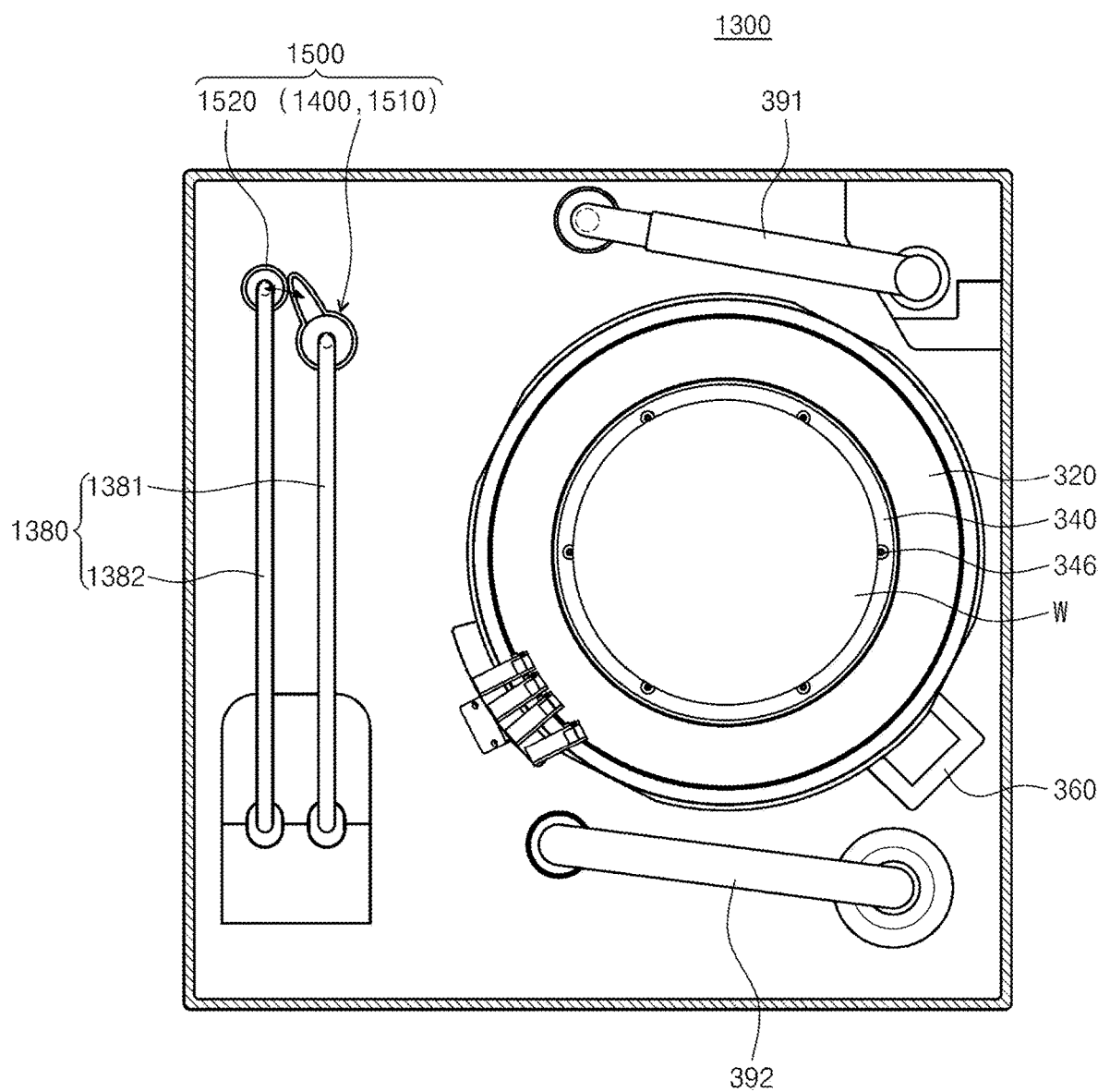
FIG. 6 is a plan view illustrating a substrate treating apparatus according to another embodiment of the inventive concept.
Figure 7:
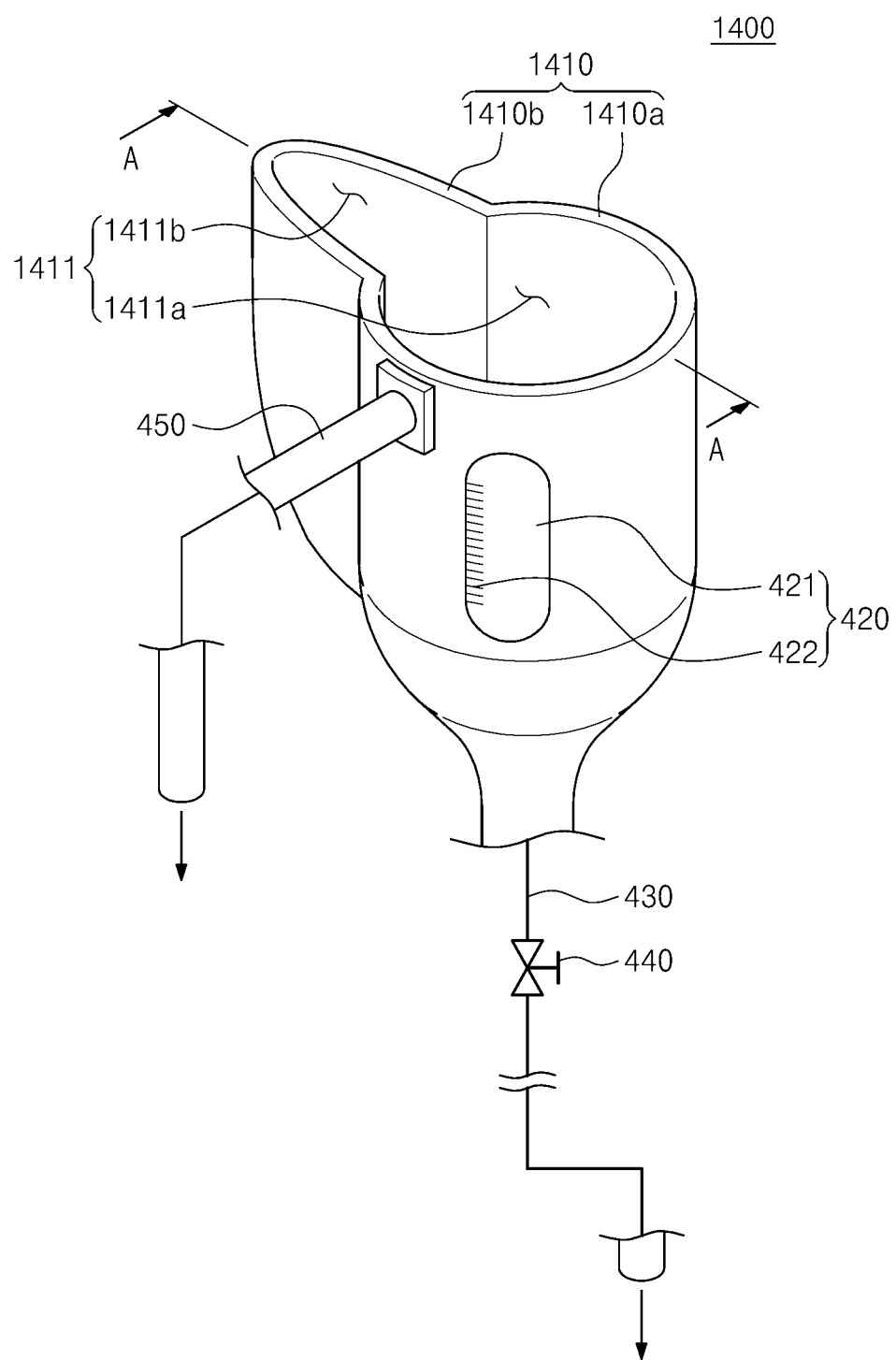
FIG. 7 is a perspective view illustrating an example of a flow rate measuring unit of FIG. 6.
Figure 8:
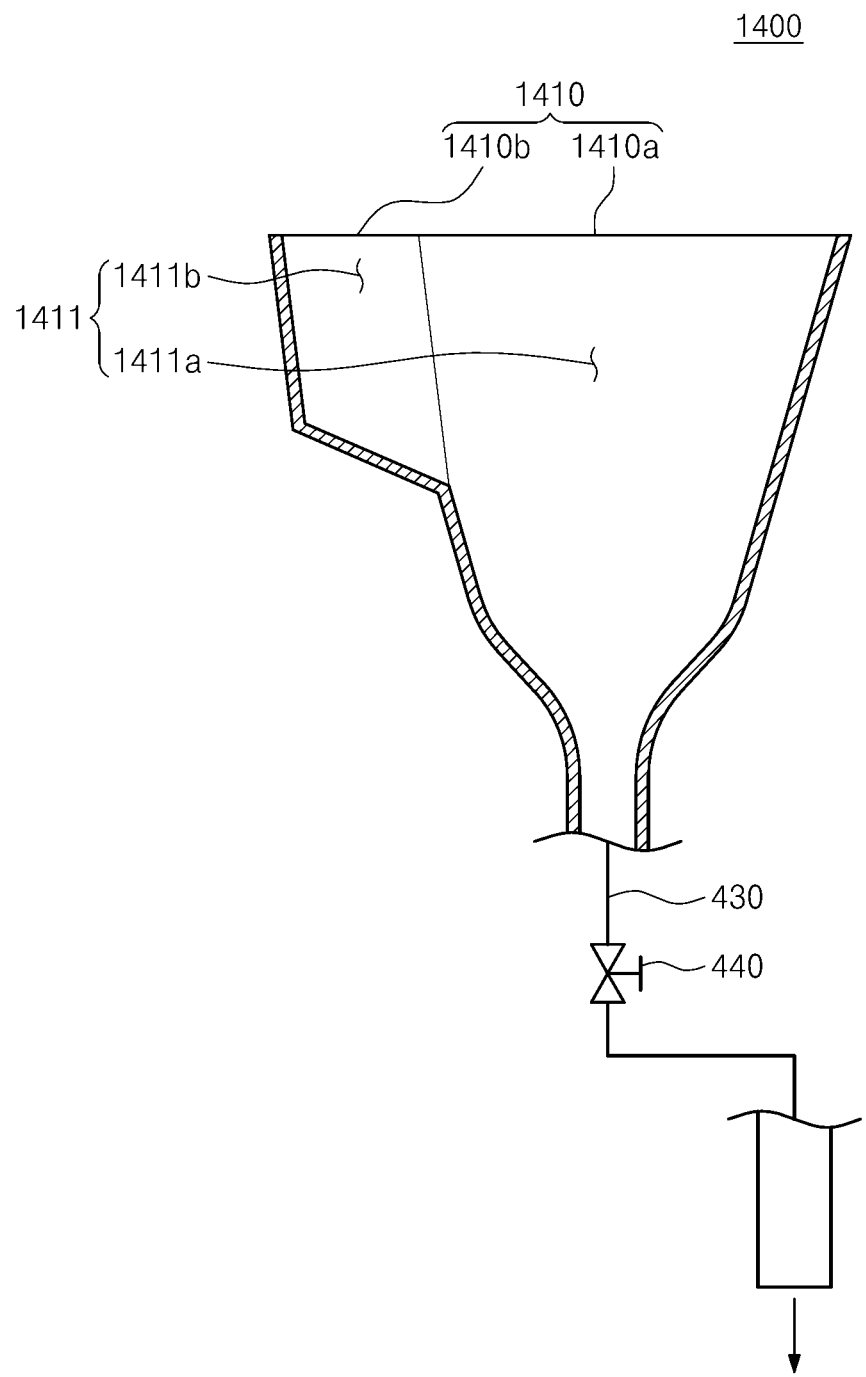
FIG. 8 is a sectional view of the flow rate measuring unit of FIG. 7, when viewed from direction AA.

FIG. 6 is a plan view illustrating a substrate treating apparatus 1300 according to another embodiment of the inventive concept. FIG. 7 is a perspective view illustrating an example of a flow rate measuring unit 1400 of FIG. 6. FIG. 8 is a sectional view of the flow rate measuring unit 1400 of FIG. 7, when viewed from direction AA. Referring to FIGS. 6 to 8, unlike in the substrate treating apparatus 300 of FIG. 2, two treatment liquid nozzles 1380 may be provided. For example, the treatment liquid nozzles 1380 include a first nozzle 1381 and a second nozzle 1382. The first nozzle 1381 may supply a first treatment liquid, and the second nozzle 1382 may supply a second treatment liquid. The first nozzle 1381 and the second nozzle 1382 may move process locations and standby location thereof. The process locations are locations at which the discharge holes of the first nozzle 1381 and the second nozzle 1382, through which the treatment is discharged, are located on the vertically upper side of the housing 320, and the standby locations are locations at which the discharge holes of the first nozzle 381 and the second nozzle 382, through which the treatment is discharged, deviate from the vertical upper side of the housing 320. The first nozzle 1381 and the second nozzle 1382 may be swing type nozzles.

In this case, the container 1410 may include a main container 1410a and a first auxiliary container 1410b. The main container 1410a has a main accommodation space 1411a, to which the first nozzle 1381 discharges the treatment liquid, in the interior thereof. The first auxiliary container 1410b has a first auxiliary accommodation space 1411b to which the second nozzle 1382 discharges the treatment liquid, in the interior thereof. According to an embodiment, the first auxiliary container 1410b protrude from a side wall of the main container 1410a to the outside. When viewed from the top, the area of the first auxiliary container 1410b is smaller than the area of the main container 1410a. Accordingly, the space occupied by the first auxiliary container 1410b may be reduced, and an interference with other configurations of the apparatus may be minimized. The treatment liquid discharged to the first auxiliary container 1410b may be introduced into the main accommodation space 1411a. For example, the depth of the first auxiliary accommodation space 1411b is smaller than the depth of the main accommodation space 1411a. The first auxiliary accommodation space 1411b may be communicated with the main accommodation space 1411a. The bottom surface of the first auxiliary accommodation space 1411b may be inclined downwards along a direction that faces the main accommodation space 1411a. Unlike this, the container 1410 may have various shapes by which the treatment liquid nozzles 1380 may easily discharge the treatment liquid into the accommodation space.

Further, in this case, the standby port 1500 may include a first standby port 1510 and a second standby port 1520. The first nozzle 1381 discharges the treatment liquid while standing by on the first standby port 1510. The first standby port 1510 discharges the treatment liquid discharged from the first nozzle 1381 to the outside. The second nozzle 1382 discharges the treatment liquid while standing by on the second standby port 1520. The second standby port 1520 discharges the treatment liquid discharged from the second nozzle 1382 to the outside. The second standby port 1520 and the first standby port 1510 are arranged in the apparatus to be adjacent to each other. The first standby port 1510 may be provided in the flow rate measuring unit 1400. In this case, the first auxiliary container 1410b is located between the main container 1410a and the second standby port 1520. Accordingly, the first auxiliary container 1410b is located such that the second nozzle 1382 may easily move between the standby location and the first auxiliary container 1410b. Further, because one of the standby ports 1500 is provided in the flow rate measuring unit 1400, a separate space for installing the flow rate measuring unit 1400 in the apparatus is not required.

The other configurations, structures, and functions of the elements other than the treatment liquid nozzle 1380, the flow rate measuring unit 1400, and the standby port 1500 of the substrate treating apparatus 1300 are substantially the same as those of the substrate treating apparatus 1300 of FIG. 2.

Hereinafter, the method for treating a substrate according to the embodiment of the inventive concept by using the substrate treating apparatus of FIG. 2 will be described for convenience of description.

Figure 9:
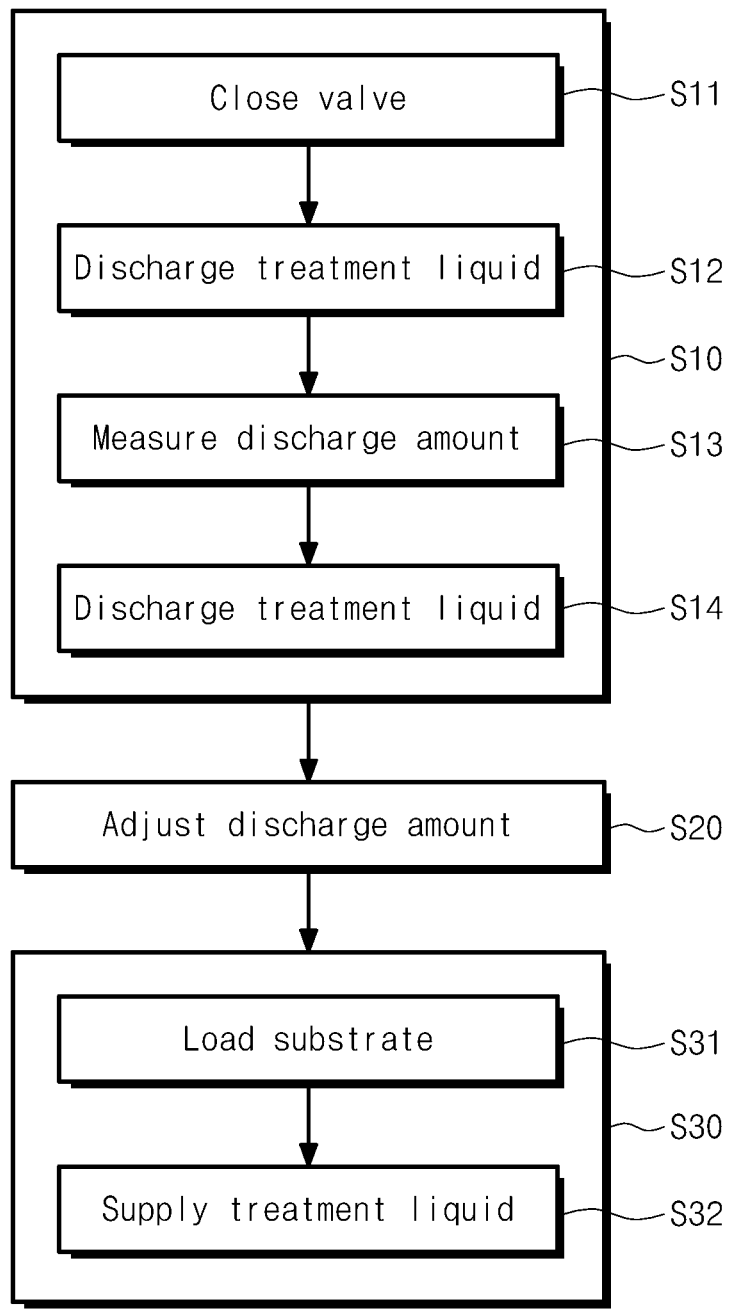
FIG. 9 is a flowchart illustrating a method for treating a substrate according to an embodiment of the inventive concept.

FIG. 9 is a flowchart illustrating a method for treating a substrate according to an embodiment of the inventive concept. Referring to FIGS. 2 to 5 and 9, the substrate treating method includes a discharge amount measuring operation S10, a discharge amount adjusting operation S20, and a treatment operation S30.

In the discharge amount measuring operation S10, a discharge amount of a treatment liquid of the treatment liquid nozzle 380 is measured. For example, in the discharge amount measuring operation S10, the discharge amount of the treatment liquid of the first nozzle 381, the second nozzle 382, and the third nozzle 383 are measured. According to an embodiment, the discharge amount measuring operation S10 includes a valve closing operation S11, a discharge operation S12, a measurement operation S13, and a drain operation S14.

In the value closing operation S11, the discharge vale 440 is closed. Accordingly, in order to measure the discharge amount per unit time of the treatment liquid of the treatment liquid nozzle 380, in the discharge operation S12 and the measurement operation S13, the treatment liquid discharged from the treatment liquid nozzle 380 may be prevented from being discharged.

The discharge operation S12 is performed after the valve closing operation S11 is performed. In the discharge operation S12, one 381, 382, and 383 of the treatment liquid nozzles 380 discharges the treatment liquid to the accommodation space 411. In the discharge operation S12, the treatment liquid nozzle 380 discharges the treatment liquid corresponding to a specific amount from a minimum amount to not more than a maximum value that may be measured by the measurement gradation 422 to the accommodation space 411. For example, in the discharge operation S12, the first nozzle 381 discharges the treatment liquid is discharged into the main accommodation space 411a, to a minimum amount that may be measured by the measurement gradation 422, that is, a gradation that is located at the lowest location of the measurement scale 422. Unlike this, in the discharge operation S12, the second nozzle 382 or the third nozzle 383 discharges the treatment liquid into the first auxiliary accommodation space 411b or the second auxiliary accommodation space 411c, to a minimum amount that may be measured by the measurement gradation 422.

The measurement operation S13 is performed after the discharge operation S12. In the measurement operation S13, the treatment liquid nozzle 380 measures a change of the amount of the treatment liquid in the accommodation space 411 while the treatment liquid is discharged into the accommodation space 411. For example, in the measurement operation S13, the change of the amount of the treatment liquid in the main accommodation space 411a is measured by using the measurement window 421 and the measurement gradation 422 while the first nozzle 381 discharges the treatment liquid into the accommodation space 411a for a specific period of time. In this case, the first nozzle 381 discharges the treatment liquid for a preset period of time. For example, the specific period of time may be 30 seconds.

The drain operation S14 is performed after the measurement operation S13. In the drain operation S14, the treatment liquid in the accommodation space 411 is drained to the outside by opening the drain valve 440. The drain valve 440 is maintained generally in an opened state in the cases other than the valve closing operation S11, the discharge operation S12, and the measurement operation S13. Accordingly, in the cases other than the valve closing operation S11, the discharge operation S12, and the measurement operation S13, the flow rate measuring unit 400 may function as a first standby port 510.

When a plurality of treatment liquid nozzles 380, the discharge amounts of which need to be adjusted, after a valve closing operation S11, a discharge operation S12, and a measurement operation S13, and a drain operation S14 are performed on one treatment liquid nozzle 380, a valve closing operation S11, a discharge operation S12, a measurement operation S13, and a drain operation S14 are performed on another treatment liquid nozzle 380.

The discharge amount adjusting operation S20 is performed after the discharge amount measuring operation S10 is performed. When a plurality of treatment liquid nozzles 380 are provided, the discharge amount adjusting operation S20 may be performed after the discharge amount measuring operation S10 is performed on all the treatment liquid nozzles 380, the discharge amounts of which need to be adjusted. Unlike this, after the discharge amount measuring operation S10 and the discharge amount adjusting operation S20 are performed on one of the treatment liquid nozzles 380, the discharge amounts of which need to be adjusted, the discharge amount measuring operation S10 and the discharge amount adjusting operation S20 may be performed on another treatment liquid nozzle 380. In the discharge amount adjusting operation S20, the discharge amount of the treatment liquid of the treatment liquid nozzle 380 is adjusted according to the discharge amount per unit time of the treatment liquid nozzle 380, which has been measured in the discharge amount measuring operation S10. For example, when the discharge amount per unit time of the first nozzle 381 measured by the discharge amount measuring operation S10 is smaller than an amount that is suitable for treating the substrate W positioned on the spin head 340, the discharge amount per unit time of the first nozzle 381 is adjusted to be increased. In contrast, when the discharge amount per unit time of the first nozzle 381 measured by the discharge amount measuring operation S10 is larger than an amount that is suitable for treating the substrate W positioned on the spin head 340, the discharge amount per unit time of the first nozzle 381 is adjusted to be decreased. The method for adjusting the discharge amounts of the second nozzle 382 and the third nozzle 383 in the discharge amount adjusting operation S20 is substantially the same as the case of first nozzle 381.

In the treatment operation S30, the substrate W is treated by supplying the treatment liquid to the substrate W positioned on the support unit 340 with the treatment liquid nozzle 380. When a plurality of treatment liquid nozzles 380 are provided, the treatment operation S30 may be performed after the discharge amount measuring operation S10 and the discharge amount adjusting operation S20 are performed on all the treatment liquid nozzles 380. Unlike this, selectively, the treatment operation S30 may be performed after the discharge amount measuring operation S10 and the discharge amount adjusting operation S20 are performed on some of the treatment liquid nozzles 380, the discharge amounts of which need to be adjusted. The treatment operation S30 may be repeated several times. When the treatment operation S30 is repeated several times, a suitable range of the discharge amount per unit time of the treatment liquid nozzle may be maintained when the substrate is treated by performing the discharge adjusting operation S10 and the discharge amount adjusting operation S20 again. The treatment operation S30 includes a substrate loading operation S31 and a treatment liquid supplying operation S32. In the substrate loading operation S31, an external feeding unit positions the substrate W on the support unit 340. In the treatment liquid supplying operation S33, the substrate W is treated by supplying the treatment liquid to the substrate W positioned on the support unit 340 with the treatment liquid nozzle 380. Thereafter, the treated substrate W is carried out to the substrate treating apparatus 300 by the feeding unit.

Figure 10:
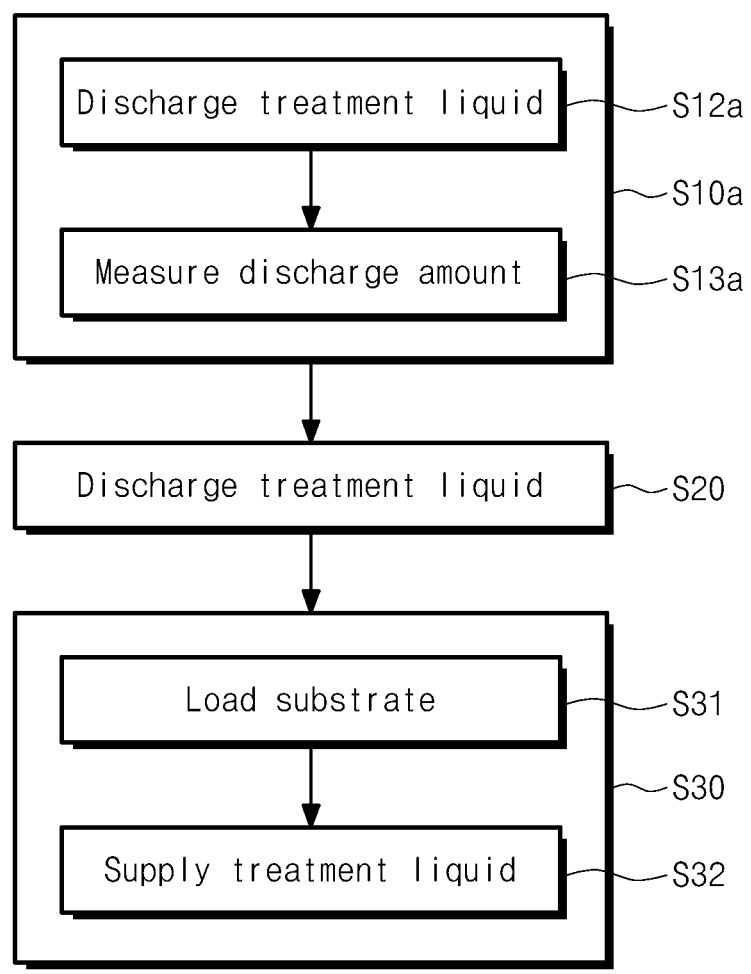
FIG. 10 is a flowchart illustrating a method for treating a substrate according to another embodiment of the inventive concept.

FIG. 10 is a flowchart illustrating a method for treating a substrate according to another embodiment of the inventive concept. When the flow rate of the treatment liquid that may be discharged through the drain line 430 is smaller than the discharge amount of the treatment liquid nozzle 380, the drain line 430 may not be closed in the discharge operation S12a because the level of the treatment liquid in the accommodation space increases while the treatment liquid nozzle 380 discharges the treatment liquid to the accommodation space to measure the discharge amount of the treatment liquid nozzle 380 even in a state in which the drain line 430 is opened. Accordingly, the discharge amount measuring operation S10i a includes a discharge operation S12a and a measurement operation S13a, and unlike the case of FIG. 9, the drain valve 440 is opened before the discharge operation Sl2a and the operation of opening the drain valve 440 is not necessary after the measurement operation S13a. The other processes of the method for treating the substrate are substantially the same as the substrate treating method of FIG. 9.

As described above, according to the inventive concept, the discharge amounts of the treatment liquid nozzles 380 and 1380 may be easily measured by providing some of the standby ports to the flow rate measuring unit 400 and 1400 having the above-mentioned characteristics. Further, the liquid used for the measurement of the discharge amounts of the treatment liquid nozzles 380 and 1380 may be easily discharged. Further, because the operator does not have to directly perform a measurement by using a measuring cylinder, the operation may be prevented from being exposed to danger when the discharge amounts of the treatment liquid nozzles 380 and 1380 are measured.

According to an embodiment of the inventive concept, the discharge amount of the nozzle may be easily measured.

According to an embodiment of the inventive concept, the liquid used for measuring the discharge amount of the nozzle may be easily discharged.

Further, according to an embodiment, the operator may be prevented from being exposed to danger when the discharge amount of the nozzle is measured.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:
1. A substrate treating apparatus comprising:
a housing that provides a space for performing a substrate treating process therein;
a supporter configured to hold a substrate and configured to rotate the substrate;
a treatment liquid nozzle group that supplies treatment liquid to the substrate positioned on the supporter; and
a flow rate measuring unit that measures a discharge amount of treatment liquid discharged by the treatment liquid nozzle group,
wherein the flow rate measuring unit includes:
a container located outside the housing and having an accommodation space, an upper side of which is opened and in which treatment liquid discharged from the treatment liquid nozzle group is accommodated, in an interior thereof;
a measurement window configured to measure an amount of treatment liquid accommodated in the accommodation space; and
a drain line through which treatment liquid in the container is drained,
wherein the treatment liquid nozzle group includes a first nozzle and a second nozzle that are moved independently from each other and stand by at a first standby location and a second standby location, respectively,
wherein the accommodation space includes:
a main accommodation space, to which the first nozzle discharges treatment liquid; and
a first auxiliary accommodation space, to which the second nozzle discharges treatment liquid,
wherein the first auxiliary accommodation space is communicated with the main accommodation space,
wherein the main accommodation space is located directly below the first standby location of the first nozzle, and the first auxiliary accommodation space is located between the second standby location and the main accommodation space and is located below a moving path of the second nozzle,
wherein a moving path of the first nozzle and the moving path of the second nozzle are different, and
wherein, when viewed from the top, the first nozzle and the second nozzle are provided with different lengths.

2. The substrate treating apparatus of claim 1, wherein the measurement window is provided in a portion of a side wall of the container and through which treatment liquid accommodated in the accommodation space is observed, and
wherein the measurement window includes a measurement gradient by which a level of treatment liquid accommodated in the accommodation space can be measured.

3. The substrate treating apparatus of claim 2, wherein when viewed from the top, an area of the first auxiliary accommodation space is smaller than an area of the main accommodation space.

4. The substrate treating apparatus of claim 3, wherein treatment liquid discharged to the first auxiliary accommodation space is introduced into the main accommodation space.

5. The substrate treating apparatus of claim 4, wherein a depth of the first auxiliary accommodation space is smaller than a depth of the main accommodation space, the first auxiliary accommodation space is communicated with the main accommodation space, and a bottom surface of the first auxiliary accommodation space is inclined downwards along a direction that faces the main accommodation space.

6. The substrate treating apparatus of claim 1, wherein the treatment liquid nozzle group further includes:
a third nozzle that moves independently and stands by at a third standby location,
wherein the container further includes:
a second auxiliary accommodation space to which the third nozzle discharges treatment liquid, and
wherein when viewed from the top, an area of the second auxiliary accommodation space is smaller than the area of the main accommodation space.

7. The substrate treating apparatus of claim 6, wherein a depth of the second auxiliary accommodation space is smaller than a depth of the main accommodation space, the second auxiliary accommodation space is communicated with the main accommodation space, and a bottom surface of the second auxiliary accommodation space is inclined downwards along a direction that faces the main accommodation space.

8. The substrate treating apparatus of claim 7, wherein the first auxiliary accommodation space and the second auxiliary accommodation space are provided on opposite sides with respect to the main accommodation space.

9. The substrate treating apparatus of claim 1, wherein the first auxiliary accommodation space is located between the first standby location and the second standby location.

10. The substrate treating apparatus of claim 6, wherein a depth of the second auxiliary accommodation space is smaller than a depth of the main accommodation space, the second auxiliary accommodation space is communicated with the main accommodation space, and
wherein a bottom surface of the second auxiliary accommodation space has a third inclination which is less steep than a first inclination.

11. The substrate treating apparatus of claim 10, wherein the first auxiliary accommodation space and the second auxiliary accommodation space are provided on opposite sides with respect to the main accommodation space.

12. The substrate treating apparatus of claim 6, wherein the second standby location, the first standby location, and the third standby location are sequentially arranged in a row,
wherein the first auxiliary accommodation space is located between the main accommodation space and the second standby location, and
wherein the second auxiliary accommodation space is located between the main accommodation space and the third standby location.

13. The substrate treating apparatus of claim 1, further comprising:
a drain valve that opens and closes the drain line.

14. The substrate treating apparatus of claim 1, wherein an overflow preventing line that prevents treatment liquid from overflowing from the accommodation space is connected to a side wall of the container.

15. The substrate treating apparatus of claim 1, wherein the main accommodation space is not located below the moving path of the second nozzle.

16. The substrate treating apparatus of claim 6, wherein the second auxiliary accommodation space is located between the third standby location and the main accommodation space and is located below a moving path of the third nozzle.

17. A method for measuring a discharge amount of treatment liquid of a treatment liquid nozzle by using the substrate treating apparatus claimed in claim 13, the method comprising:
a discharging step of discharging a first treatment liquid into the accommodation space by the first nozzle; and
a measuring step of measuring an amount of the first treatment liquid in the accommodation space.

18. The method of claim 17, wherein in the discharging step, a specific amount of the first treatment liquid is discharged.

19. The method of claim 18, further comprising:
a closing valve step of closing the drain valve before the discharging step.

20. The method of claim 19, further comprising:
a drain step of discharging the first treatment liquid in the accommodation space to outside the accommodation space by opening the drain valve after the measuring step.

21. A method for treating a substrate by using the substrate treating apparatus of claim 13, the method comprising:
a measuring a discharge amount step of measuring a discharge amount of a first treatment liquid from the first nozzle;
an adjusting the discharge amount step of adjusting a discharge amount of the first treatment liquid from the first nozzle; and
a treating step of treating the substrate by supplying the first treatment liquid to the substrate while the substrate is positioned on the supporter, wherein the treating step comprises supplying the first treatment liquid to the substrate from the first nozzle.

22. The method of claim 21, wherein the measuring a discharge amount step includes:
a discharging step of discharging the first treatment liquid into the accommodation space from the first nozzle; and
a measuring step of measuring an amount of the first treatment liquid in the accommodation space.

23. The method of claim 22, wherein the measuring a discharge amount step further includes:
a closing valve step of closing the drain valve before the discharging step.

24. The method of claim 23, wherein the measuring a discharge amount step further includes:
a drain step of draining the first treatment liquid in the accommodation space to outside the accommodation space by opening the drain valve after the measuring step.

25. The method of claim 22, wherein in the discharging step, a specific amount of the first treatment liquid is discharged.

26. The method of claim 22, wherein the treating step includes:
a loading step of positioning the substrate on the supporter; and
a supplying step of supplying the first treatment liquid onto the substrate from the first nozzle.

* * * * *